(12) United States Patent
Hashimoto et al.

(10) Patent No.: US 7,405,421 B2
(45) Date of Patent: Jul. 29, 2008

(54) OPTICAL INTEGRATED DEVICE

(75) Inventors: Jun-ichi Hashimoto, Yokohama (JP);
Tsukuru Katsuyama, Yokohama (JP);
Kenji Koyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 16 days.

(21) Appl. No.: 11/089,019

(22) Filed: Mar. 25, 2005

(65) Prior Publication Data
US 2005/0220391 A1    Oct. 6, 2005

(30) Foreign Application Priority Data
Mar. 30, 2004  (JP)  .............. 2004-099856

(51) Int. Cl.
*H01L 29/06*  (2006.01)
(52) U.S. Cl. .............. 257/14; 257/37; 257/E49.003; 438/31
(58) Field of Classification Search ............ 257/11, 257/E21.11, 12–14, 22, 37, E49.003; 372/43.01; 438/31
See application file for complete search history.

(56) References Cited

U.S. PATENT DOCUMENTS

| 3,993,963 | A | * | 11/1976 | Logan et al. | 372/45.01 |
| 5,796,902 | A | * | 8/1998 | Bhat et al. | 385/122 |
| 6,034,983 | A | * | 3/2000 | Fujii et al. | 372/43.01 |
| 6,465,269 | B2 | * | 10/2002 | Furushima | 438/31 |
| 6,625,187 | B1 | | 9/2003 | Ikoma et al. | |
| 6,697,404 | B1 | * | 2/2004 | Sato | 372/45.01 |
| 6,798,809 | B1 | * | 9/2004 | Gambin et al. | 372/45.01 |
| 6,815,731 | B2 | * | 11/2004 | Sato | 257/103 |
| 6,909,536 | B1 | * | 6/2005 | Walker et al. | 359/337 |
| 6,955,933 | B2 | * | 10/2005 | Bour et al. | 438/22 |

FOREIGN PATENT DOCUMENTS

| JP | 63-196088 | 8/1988 |
| JP | 2001-148531 | 5/2001 |

OTHER PUBLICATIONS

Computer generated English translation of applicant's admitted prior art, Japanese published application JP 2001-148531, printed on Oct. 12, 2006.*

* cited by examiner

*Primary Examiner*—Howard Weiss
*Assistant Examiner*—John C Ingham
(74) *Attorney, Agent, or Firm*—Smith, Gambrell & Russell, LLP

(57) ABSTRACT

The present invention provides an optical device integrating an active device with a passive device without any butt joint structure between two devices. The optical integrated device of the invention includes a GaAs substrate, first and second cladding layers, and an active layer sandwiched by the first and second cladding layers. These layers are disposed on the GaAs substrate. The GaAs substrate provides a first region and a second region. The active layer comprises of the first active layer disposed on the first region and the second active layer disposed on the second region of the GaAs substrate. The first active layer has a quantum well structure whose band-gap energy smaller than 1.3 eV, while the second active layer has a quantum well structure whose band-gap energy is greater than that of the first active layer.

12 Claims, 12 Drawing Sheets

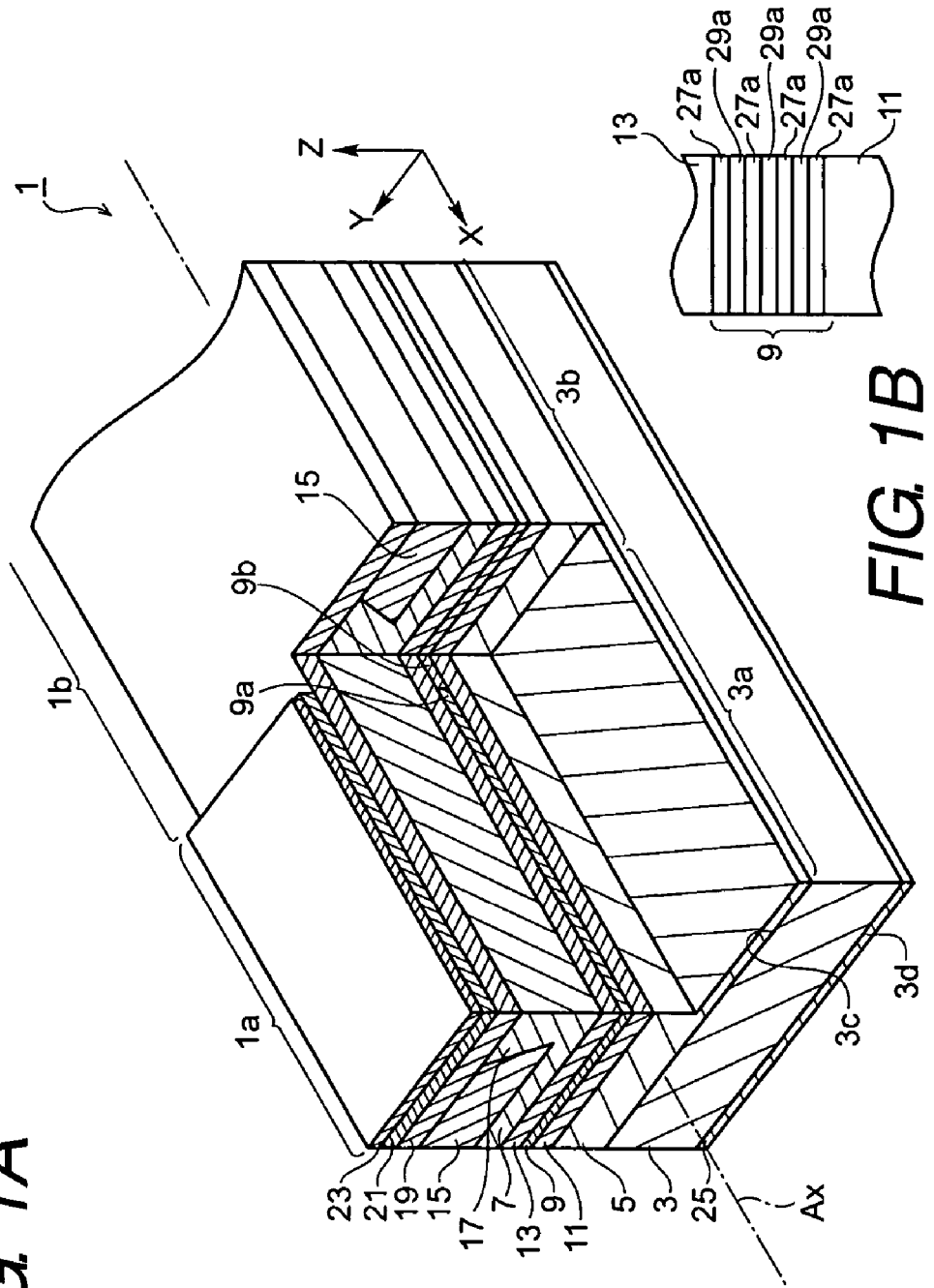
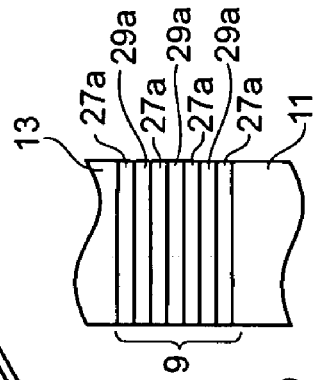

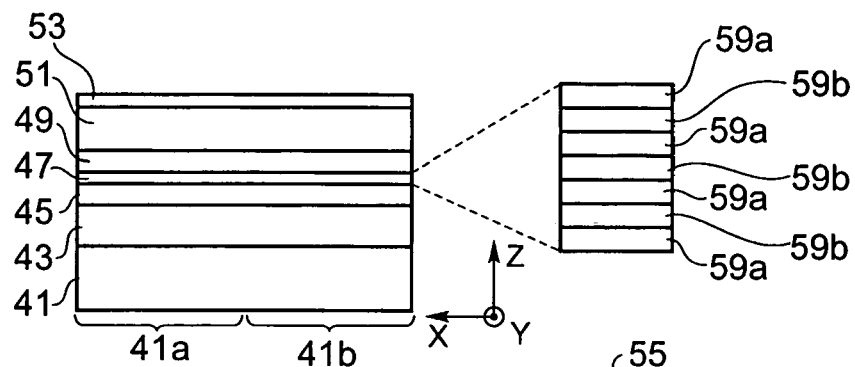
FIG. 2A
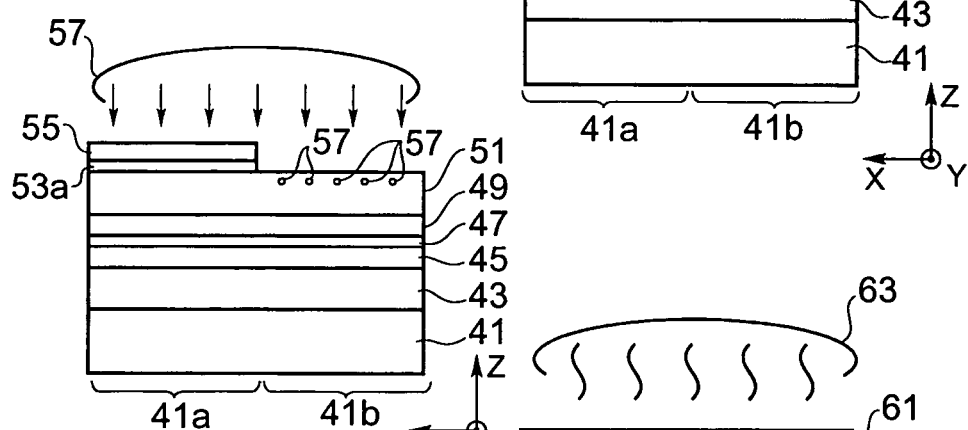
FIG. 2B
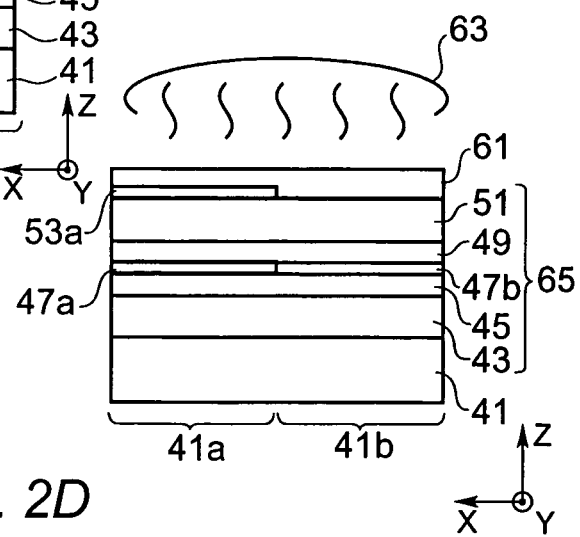
FIG. 2C
FIG. 2D

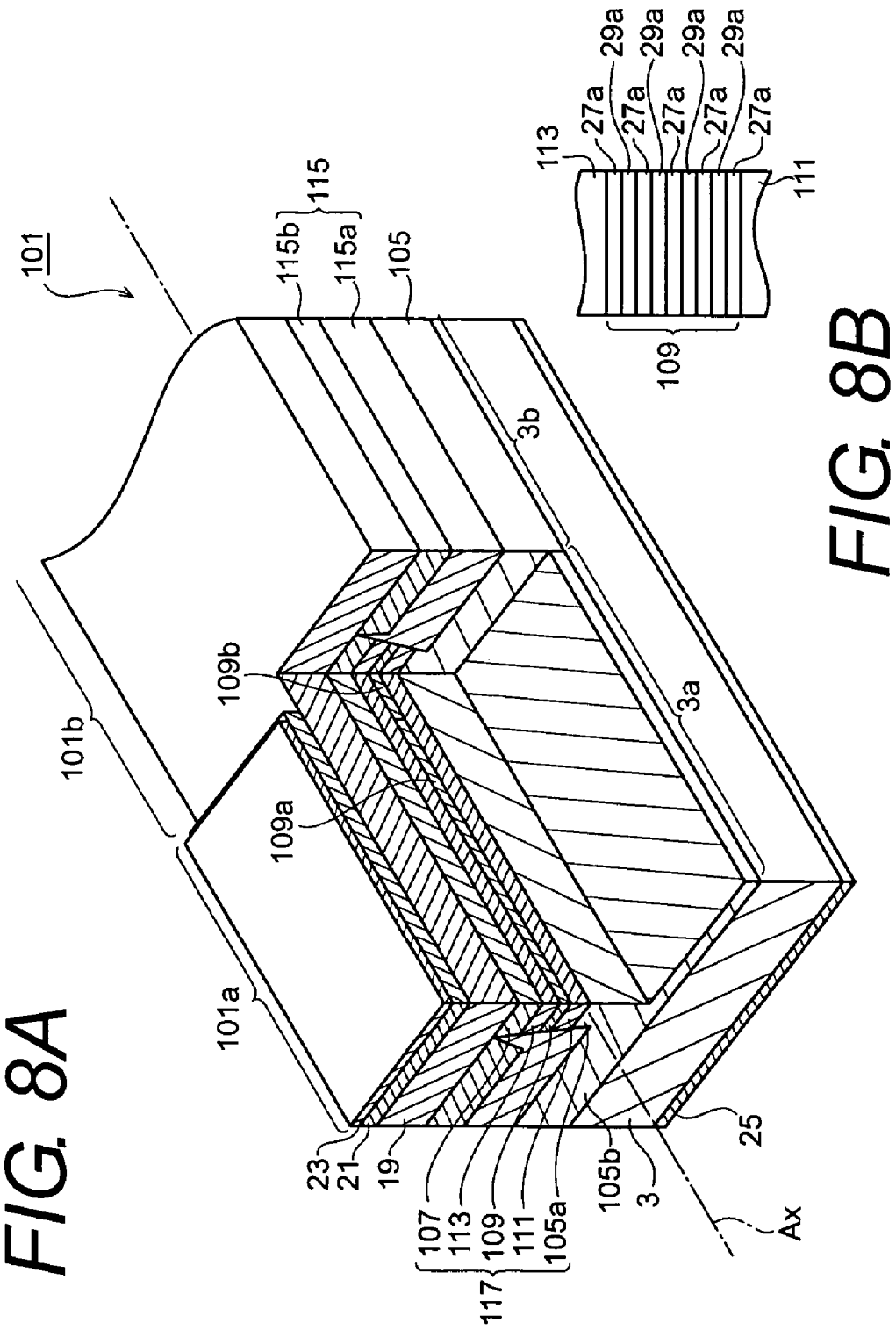
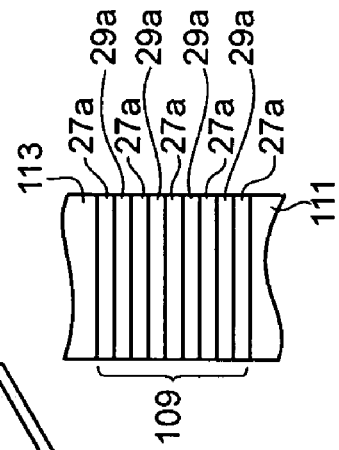
FIG. 8A
FIG. 8B

OPTICAL INTEGRATED DEVICE

BACKGROUND OF THE INVENTION

1. Field of the Invention

The present invention relates to an optical device that monolithically integrates an optically active device and an optically passive device.

2. Related Prior Art

Japanese patent published as S63-196088 has disclosed a semiconductor laser diode, an edge portion of which is widened in the band-gap energy by the diffusion of zinc (Zn) atoms. This edge portion functions as a window region for the coherent light. This window region with widened band-gap energy may prevent the laser from the COD (Catastrophic Optical Damage) and the degradation thereby.

Japanese patent published as 2001-148531 has disclosed an optically integrated device that includes an optical waveguide and an optical amplifier both provided on single GaAs substrate. The optical amplifier, optically coupled with the optical waveguide, comprises of an active layer made of $Ga_xIn_{1-x}N_yAs_{1-y}$, first and second cladding layers sandwiching the active layer therebetween. The waveguide comprises a core made of GaInNAs or GaAs, and first and second cladding layers sandwiching the core.

Optical integrated devices applicable in a wavelength range longer than 1 µm may be processed on currently available InP substrate with 3-inch diameter. A semiconductor materials with greater band-gap energy than that of Inp does not lattice-match to InP. Accordingly, in the InP system, which means that semiconductor materials considered have a lattice constant matching to that of InP, materials having comparably greater band-gap energy may not apply to the optical confinement layer and the cladding layer. This means that the band-gap difference between the active layer and layers surrounding the active layer, such as cladding layer and optical confinement layer, is not ensured, thereby reducing the carrier confinement into the active layer and degrading the performance of the device against the temperature.

The former Japanese patent, S63-196088, has related to the facet protection of the optical cavity, not relates to the optical integrated device. While, the latter Japanese patent, 2001-148531, has related to the optical integrated device applicable in the longer wavelength band. This integrated device includes an active layer made of GaInNAs related material. Since the lattice constant of GaInNAs matches to that of the GaAs, the GaAs wafer with relatively large size, 6-inches, may be used. Moreover, since the GaAs related material, such as AlGaAs and AlGaInP and having comparably greater band-gap energy than InP, may be applicable to the cladding layer and the confinement layer, the band-gap difference between the active layer and the cladding layer becomes large, accordingly, the carrier confinement within the active layer becomes effective. Therefore, in the optical integrated device using GaInNAs, the performance against the temperature may be drastically improved as compared with the InGaAs(P)/InP system.

In such optical device integrating the active device with the passive device, the light processed in the active device is necessary to be not absorbed in the passive device. Accordingly, the band-gap energy of the passive device must be greater than that of the active device. On the other hand, both devices must be smoothly coupled to each other to eliminate the reflection of light at the interface therebetween. Therefore, the latter Japanese patent has disclosed a butt joint structure, in which the optically active layers of both devices are physically come into contact after independently processed or one of active layers is processed to come into contact to the other active layer that is processed in advance.

However, in this butt joint structure, the layer structure in the active device and that in the passive device are occasionally different to each other, at least two structures may not be completely identical in the physical dimensions to each other, so the mode field diameter of the light in the active device and that in the passive device becomes different, accordingly, the reflection of light is inevitably induced at the interface.

Moreover, in the butt joint structure, the passive device is independently formed after the formation of the active device, i.e. the epitaxial layers for the passive device is, after the etching of layers for the active device, grown on thus etched portion. However, an extraordinary layer may be formed at the second growth, and this extraordinary layer degrades the interface and the optical coupling thereof which increase the reflection at the interface. Thus, the butt joint structure lacks the reliability and degrades the performance of the optical integrated device.

SUMMARY OF THE INVENTION

According to one aspect of the present invention, an optical device integrating an active device with a passive device is to be provided. The optical integrated device comprises a GaAs substrate, a first cladding layer, an active layer, and a second cladding layer. The substrate includes a first region where the active device is to be formed thereon and a second region where the passive device is formed thereon. The first and second cladding layers extend from the first region to the second region. The active layer includes a first active layer disposed on the first region and a second active layer disposed on the second region.

In the present invention, the first active layer and the second active layer have substantially same layer configuration without any butt joint structure therebetween, and the band-gap energy of the first active layer is smaller than 1.3 eV, and also smaller than that of the second active layer. Therefore, light processed in the first active layer may propagate in the second active layer without substantial reflection at the interface between the first and second active layers and without substantial absorption in the second active layer.

That is, the first active layer may have a first quantum well structure having at least one well layer, and the second active layer may also have a second quantum well structure having at least one well layer. Moreover, a width of the well layer in the second active layer is narrower than that of the first active layer. Therefore, the band-gap energy of the second active layer is greater than that of the first active layer.

The first and second active layers may include semiconductor layers composing at least nitrogen (N), or composing at least nitrogen (N), gallium (Ga), and arsenic (As). The first and second active layers may further include at least antimony (Sb) or phosphorous (P). Since semiconductor material composing nitrogen, or at least nitrogen, gallium and arsine may vary the band-gap energy as maintaining a lattice constant thereof matches to that of the GaAs substrate. Therefore, not only a large sized wafer may be applicable to the process but also the band-gap difference between the well and barrier layers may be widened, thereby enhancing the performance of the optical integrated device.

Typical semiconductor materials for the active layer are preferably GaNAs, GaInNAs, GaNAsSb, GaNAsP, GaNAsSbP, GaInNAsSb, GaInNAsP, and GaInNAsSbP. While, typical materials for the first and second cladding layers are preferably AlGaInP, GaInP, GaInAsP and AlGaAs.

One preferable structure of the present device includes a ridge in the second cladding layer, and the integrated device may further include a current blocking layer to bury the ridge of the second cladding layer. Even in this structure of the second cladding layer, the first and second active layers may smoothly couple with each other.

Another preferable structure of the present integrated device provides a mesa including the second cladding layer and the active layer, or additionally including a portion of the first cladding layer. The device may further provide a current blocking layer to bury the mesa. Even in this structure of the second cladding layer, the first and second active layers may smoothly couple with each other. Moreover, since the first and second active layers are limited in a width thereof the mode field diameter of the light in respective active layers becomes substantially identical to each other. Accordingly, the reflection at the interface may be disregarded.

The optical integrated device of the present invention preferably includes first and second optical confinement layers to confine carriers in effective into the active layer, and to confine light in effective into the active layer and these optical confinement layers. The first optical confinement layer is sandwiched by the active layer and the first cladding layer, while the second optical confinement layer is sandwiched by the active layer and the second cladding layer.

Another aspect of the present invention relates to a method of manufacturing an optical integrated device. The optical device includes a first cladding layer, an active layer and a second cladding layer. The active layer has first and second active layers, each having a quantum well structure including at least one well layer. In the present optical device, the band-gap energy of the first quantum well structure is smaller than 1.3 eV and is smaller than that of the second quantum well structure. The method comprises steps of (a) growing semiconductor layers for the first cladding layer, the active layer and the second cladding layer on a GaAs substrate. The GaAs substrate has a first region for the first active layer and a second region for the second active layer; (b) diffusing impurities into semiconductor layers only in the second region. The impurities thus diffused into the second active layer narrows an effective width of the well layer in the second active layer to increase the band-gap energy of the second active layer, accordingly, it is greater than the band-gap energy of the first active layer that is not diffused by impurities.

In the present invention, the diffusing of impurities may be carried out by implanting impurities into the semiconductor layers and by annealing the semiconductor layers. The impurities, which include both extrinsic atoms and vacancies induced by the implantation, may diffuse within the semiconductor layers and reach the active layer to disorder in moderate the quantum well structure, accordingly, to narrow the effective width of the well layers and to widen the band-gap energy thereof.

The diffusion of impurities may be carried out by depositing a film containing impurities onto the semiconductor layers and by annealing the semiconductor layers with the film, or, the diffusing of impurities may be carried out by annealing the semiconductor layers in an atmosphere containing the impurities.

BRIEF DESCRIPTION OF DRAWINGS

FIG. 1A is a perspective view showing an optical integrated device according to the present invention, and FIG. 1B is a schematic diagram showing a structure of an active layer of the optical integrated device;

Figure 3A:
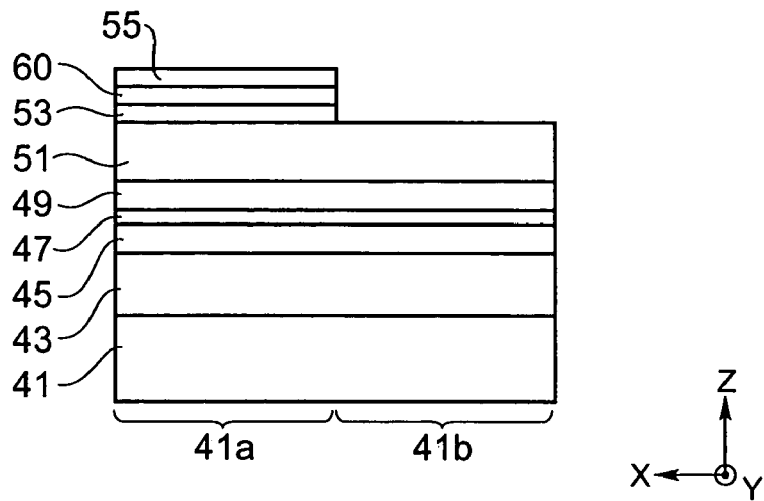
Figure 3B:
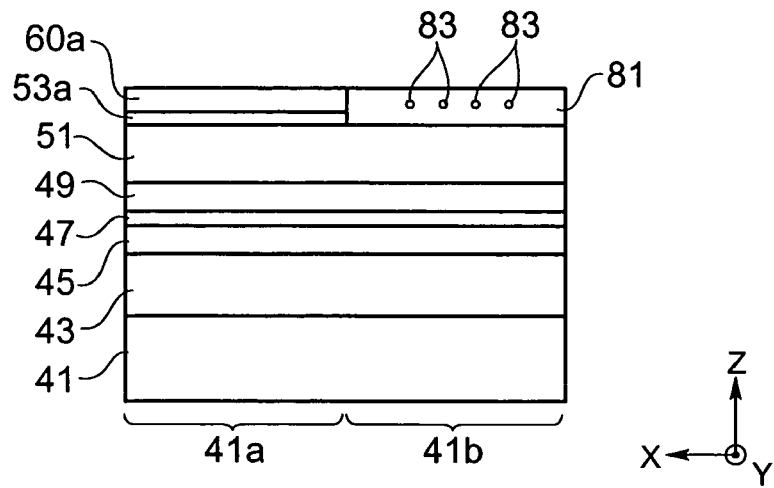
Figure 3C:
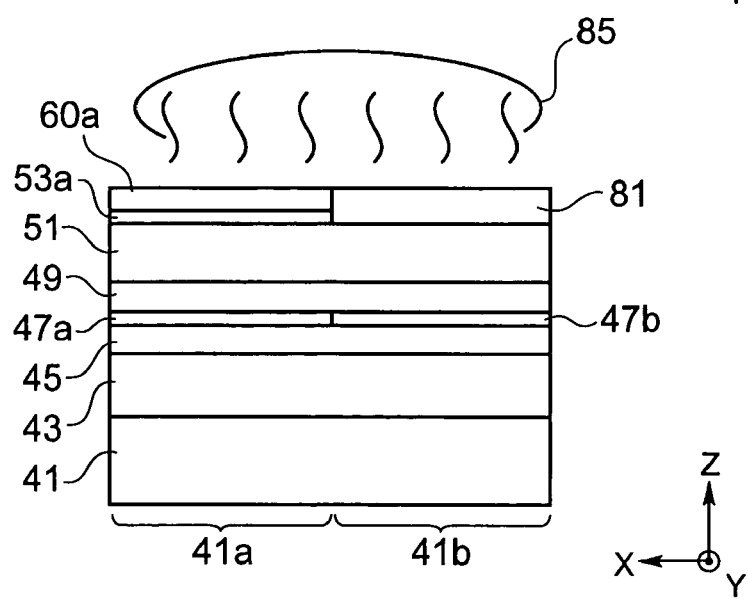
Figure 4A:
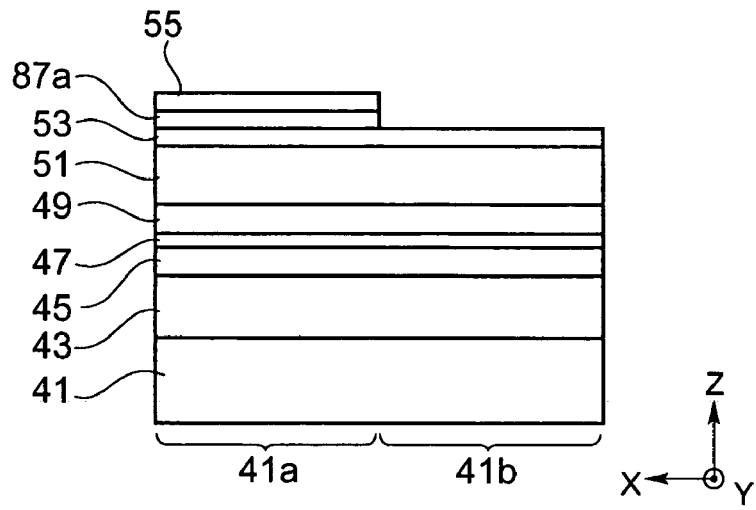
Figure 4B:
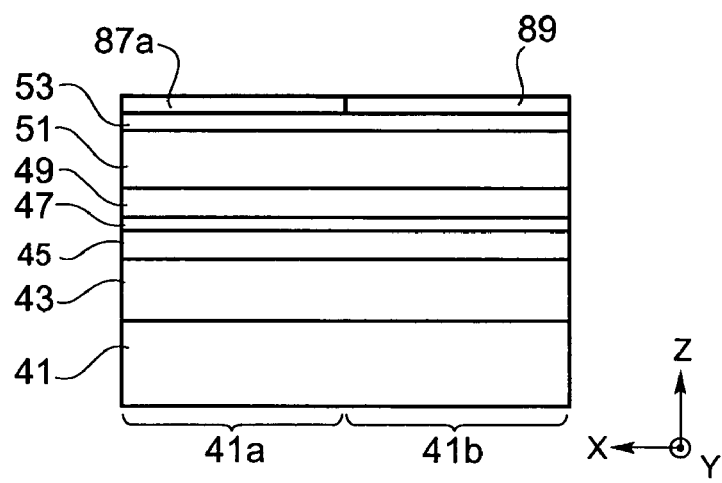
Figure 4C:
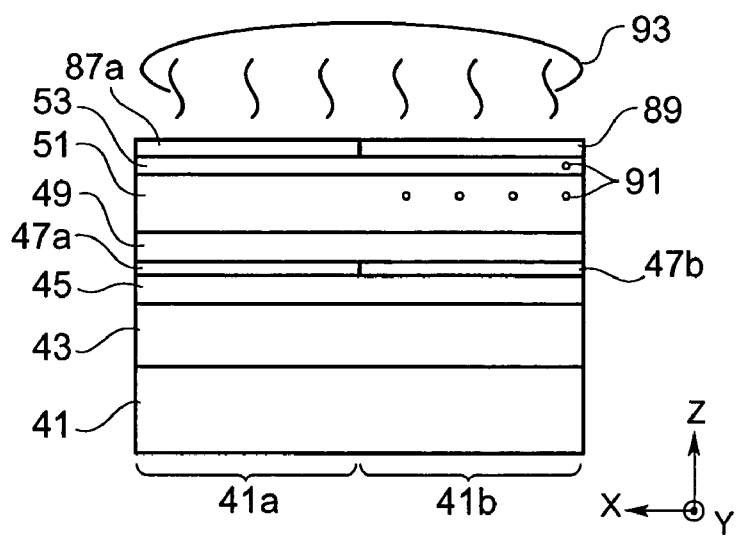
Figure 5A:
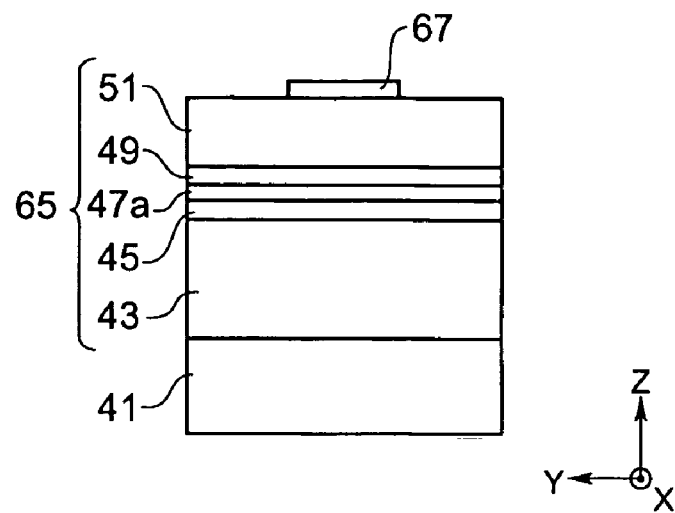
Figure 5B:
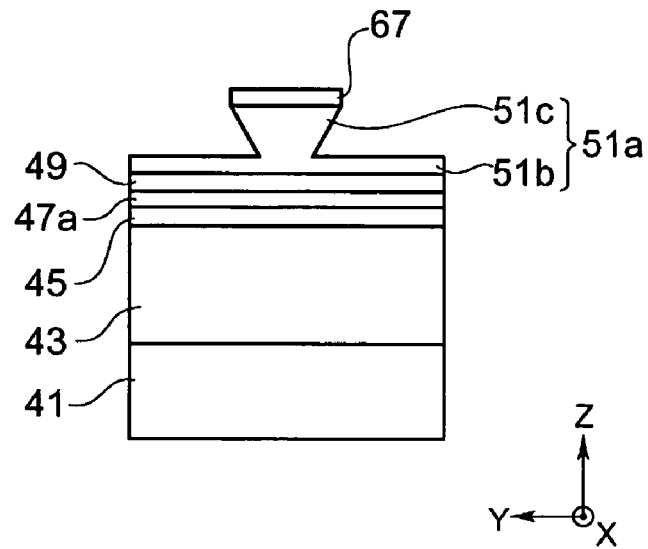
Figure 5C:
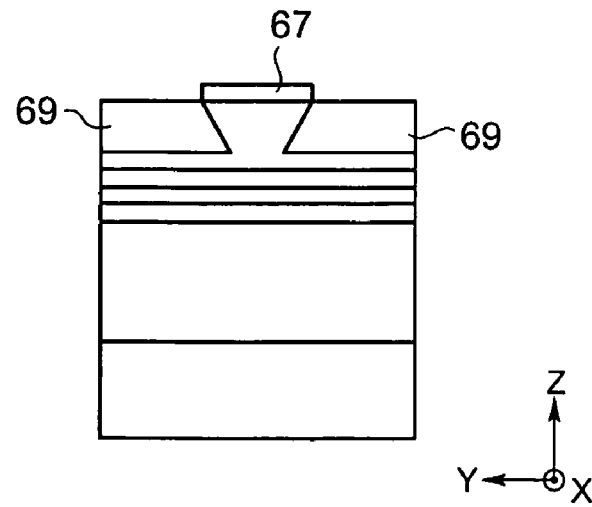
Figure 6A:
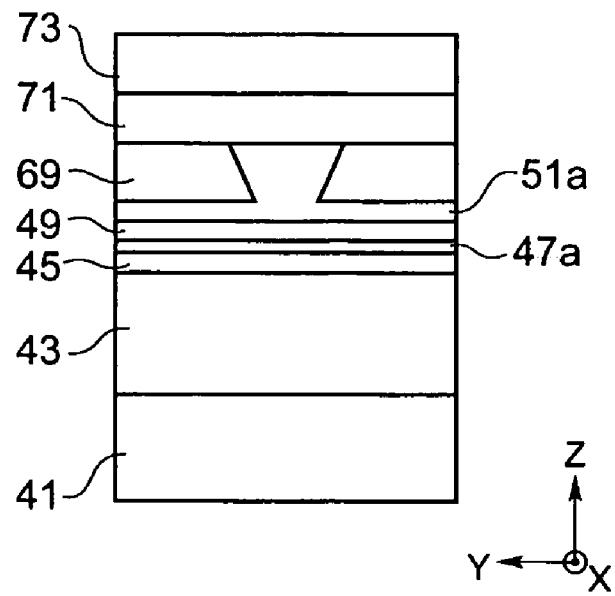
Figure 6B:
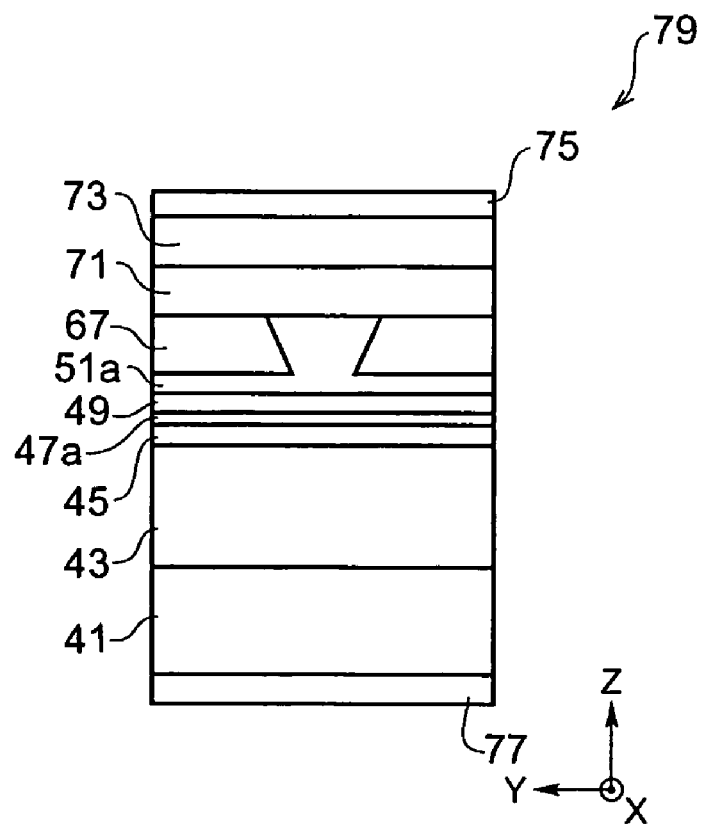
Figures 7A, 7B:
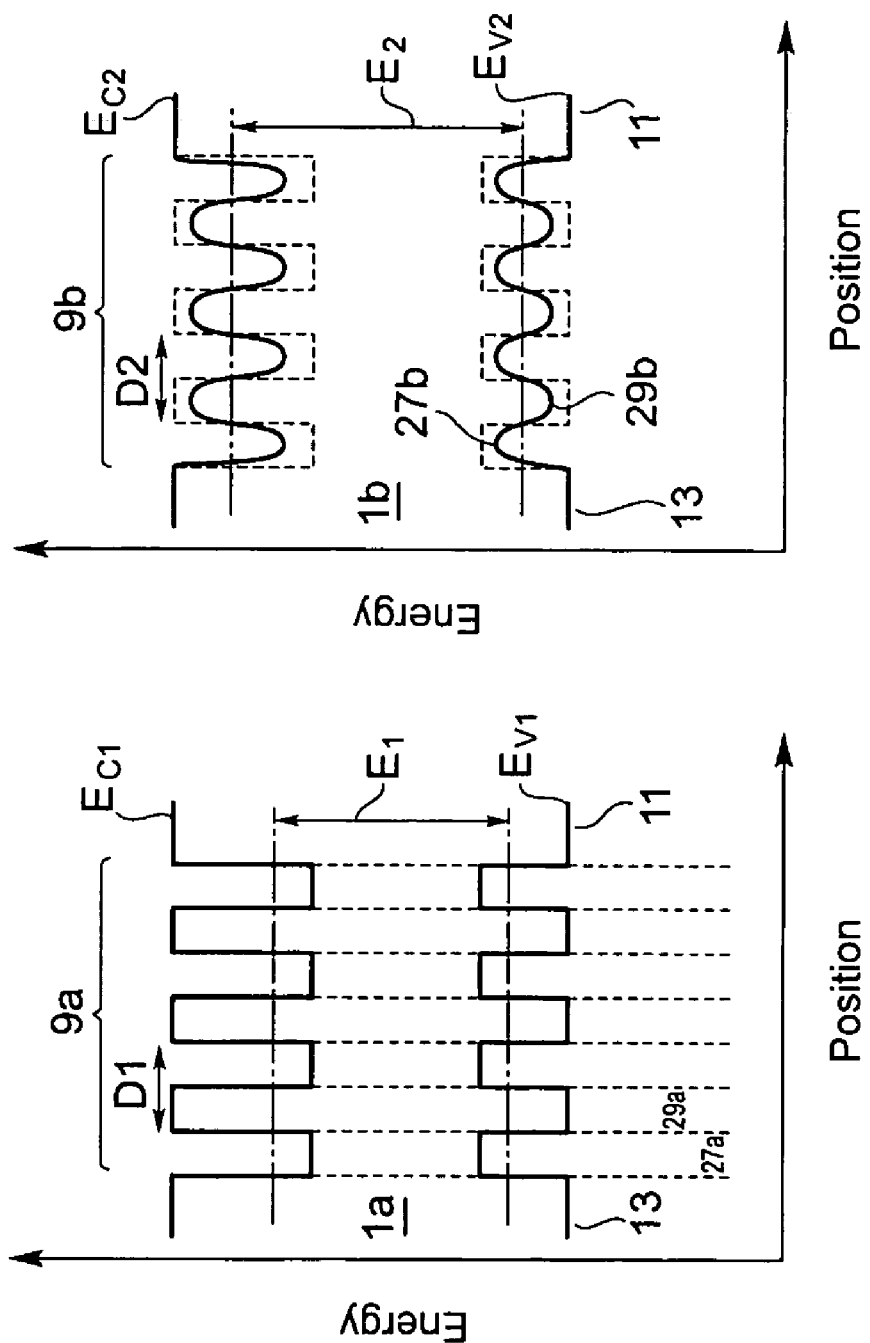

from FIG. 2A to FIG. 2D show a process for manufacturing an optical integrated device according to the second embodiment of the invention;

from FIG. 3A to FIG. 3C show modified process for forming the active layer according to the second embodiment;

from FIG. 4A to FIG. 4C show still modified process for forming the active layer according to the second embodiment of the invention;

from FIG. 5A to FIG. 5C show a process for manufacturing a buried ridge structure of the optical integrated device;

FIG. 6A and FIG. 6B show a process for manufacturing the buried ridge structure subsequent to the step shown in FIG. 5C;

FIG. 7A shows a schematic band diagram, including the conduction band Ec 1 and the valence band Ev 1, of the quantum well structure in the first active layer, while FIG. 7B shows a schematic band diagram, $E_{c2}$ and $E_{v2}$, of the quantum well structure in the second active layer.

Figure 9:
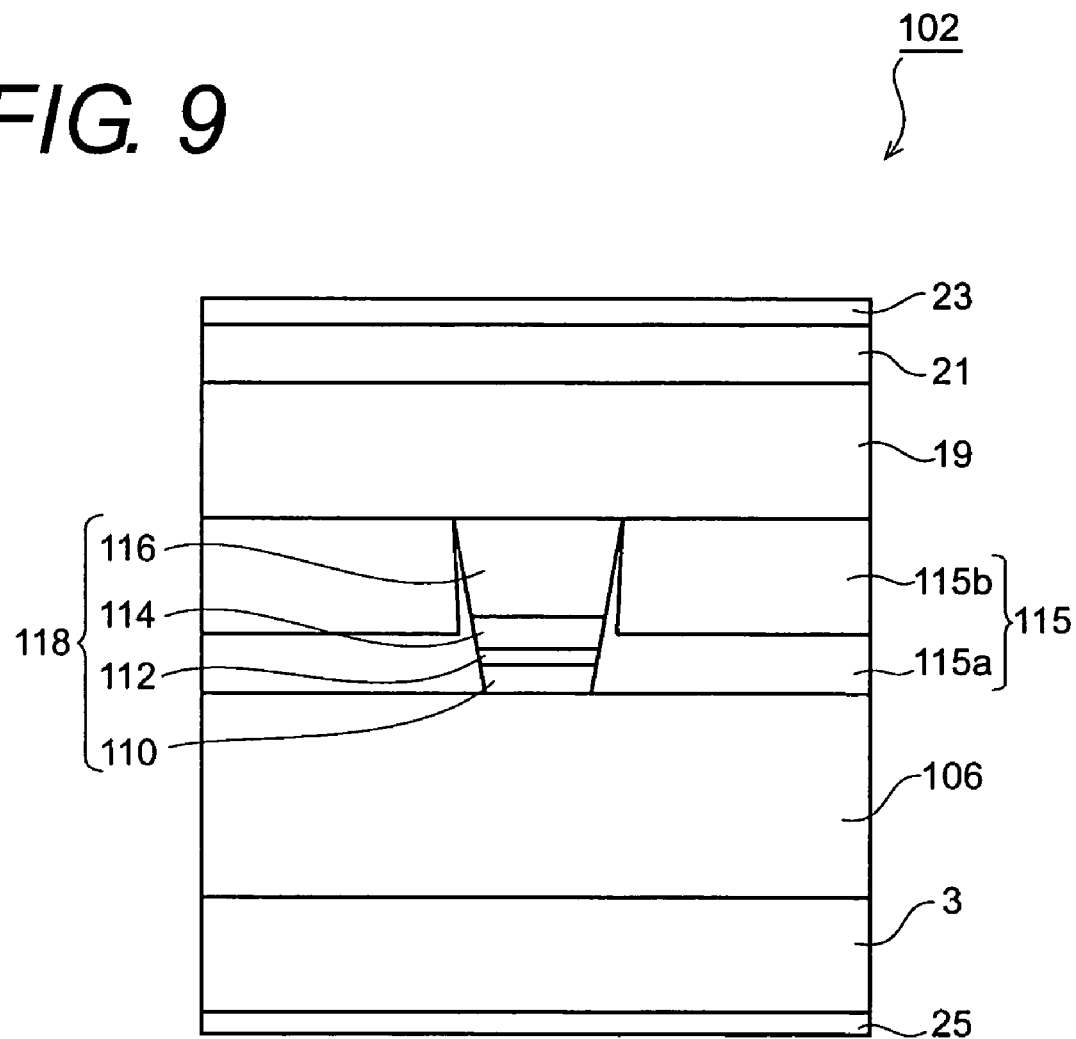
Figure 10A:
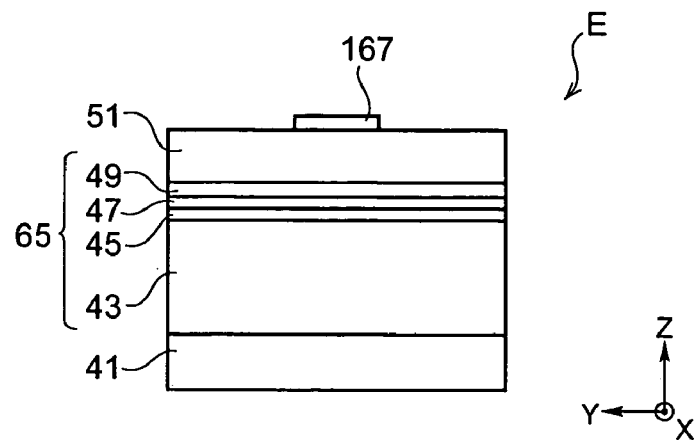
Figure 10B:
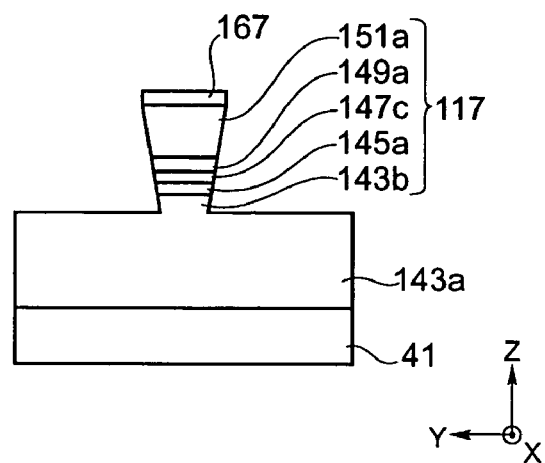
Figure 10C:
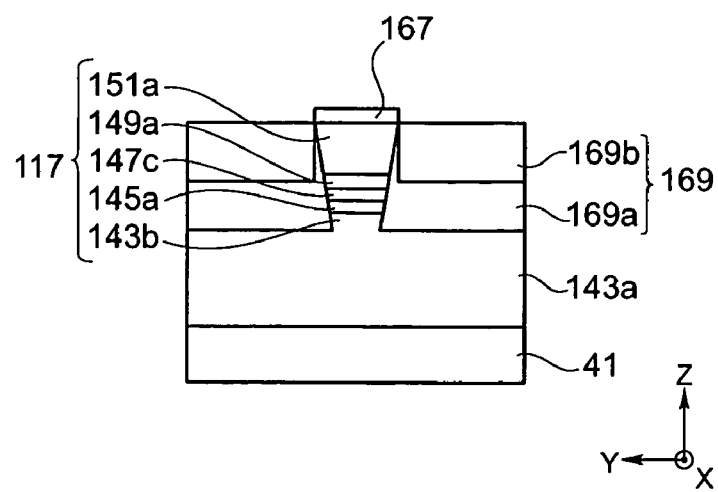
Figure 11A:
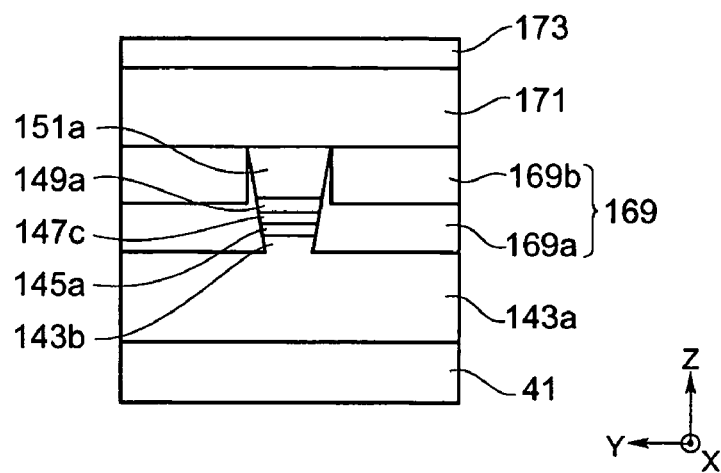
Figure 11B:
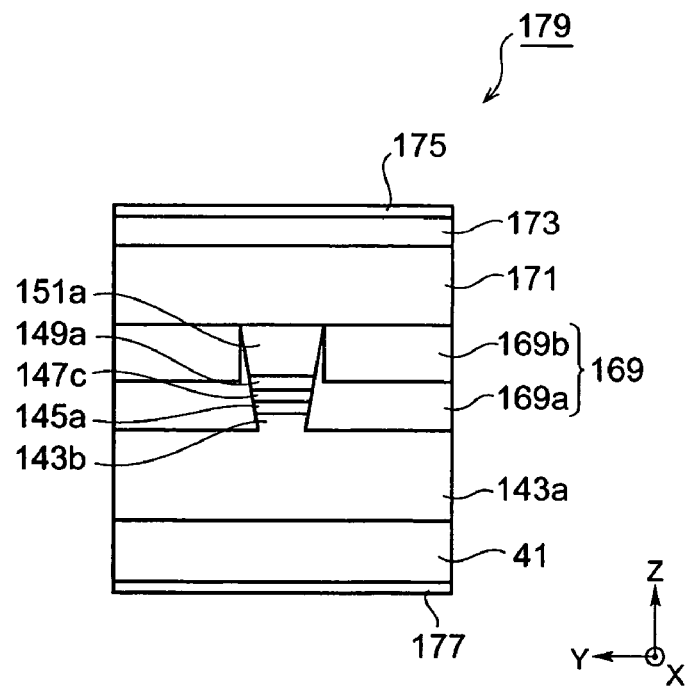
Figure 12A:
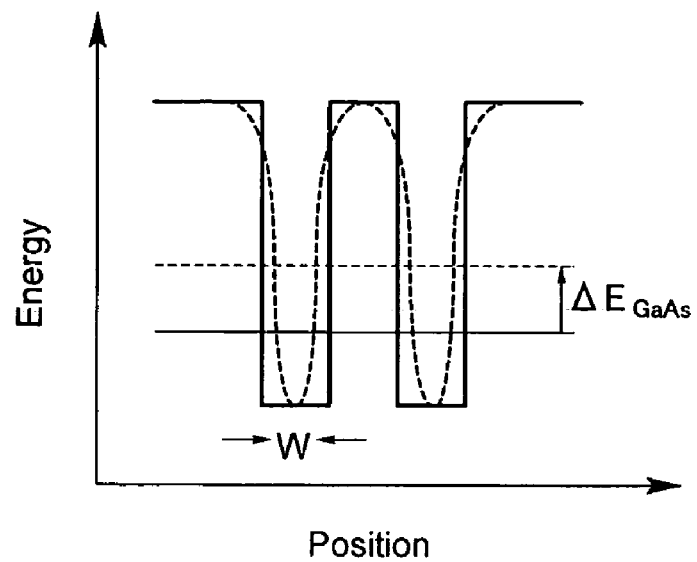
Figure 12B:
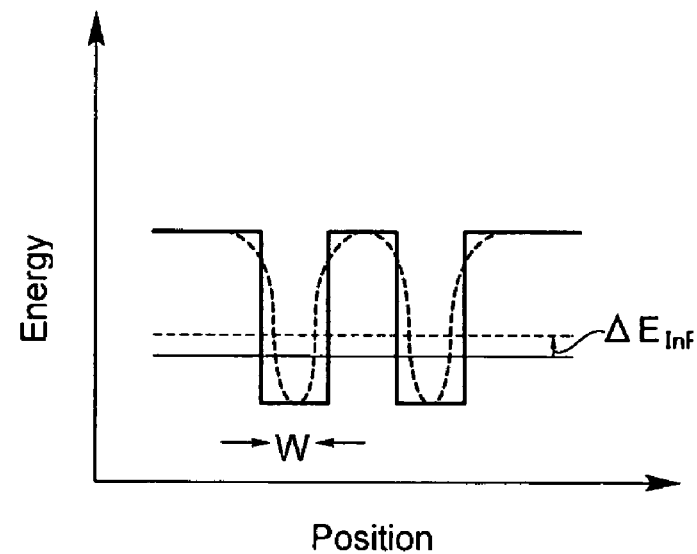

FIG. 8A is a perspective view showing an optical integrated device according to the third embodiment of the invention, and FIG. 8B shows an active layer of the integrated device shown in FIG. 8A;

FIG. 9 is a cross sectional view of a modified structure of the optical integrated device shown in FIG. 8A;

from FIG. 10A to FIG. 10C show a process for manufacturing the buried hetero-structure of the optical integrated device shown in FIG. 8A;

FIG. 11A and FIG. 11B show a process subsequent to the step shown in FIG. 10C, of the integrated optical device shown in FIG. 8A; and FIG. 12A is a schematic band diagram of the quantum well structure for materials with a lattice constant similar to that of GaAs, and FIG. 12B is a schematic band diagram of the quantum well structure for materials with a lattice constant similar to that of InP.

DESCRIPTION OF PREFERRED EMBODIMENTS

Spirits of the present invention will be easily understood by the following description as referring to accompanying drawings. Next, an optical integrated device of the invention will be described as referring to accompanying drawings. In the explanations and the drawings, if possible, same elements will be referred by same symbols or numerals without overlapping explanation.

First Embodiment

FIG. 1A is a perspective view showing an optical integrated device 1 according to the present invention, and FIG. 1B is a schematic diagram showing a structure of an active layer of the optical integrated device 1.

The optical integrated device 1 comprises a GaAs substrate 3, a first cladding layer 5, a second cladding layer 7, and an active layer 9. The GaAs substrate, with a first conduction type and a primary surface 3c of a (100) crystallographic surface, provides a first region 3a where a first device 1a is formed thereon and a second region 3b where a second device 1b is disposed thereon. These first and second regions are arranged along an axis Ax. The first cladding layer 5, showing the first conduction type, is formed in both the first and second regions, 3a and 3b, respectively. The second cladding layer 7, showing a second conduction type, is also formed in the first and second regions, 3a and 3b. The second cladding layer 7, as shown in FIG. 1A, provides a ridge 17. The active layer 9, sandwiched by the first and second cladding layers, 5 and 7, comprises of the first active layer 9a formed in the first region 3a of the substrate, and the second active layer arranged in the second region 3b of the substrate 3. The first and second active layers, 9a and 9b, respectively, may be a single-quantum well (SQW) and a multi-quantum well (MQW) with a plurality of well and barrier layers alternately stacked to each other. The first active layer 9a has band-gap energy smaller than 1.3 eV, which is equivalent to a wavelength of 0.95 μm and different to that of the second active layer 9b.

The active layers, 9a and 9b, may include a group III-V compound semiconductor layer composing nitrogen (N), or may include a semiconductor layer composing nitrogen (N), gallium (Ga) and arsenic (As). Since the semiconductor material grouped in the III-V compound semiconductor and composing nitrogen may have a lattice constant substantially matching to that of GaAs, accordingly, such semiconductor materials may be easily grown on the GaAs substrate 3. Moreover, such materials may have wide range of band-gap energy by adjusting the composition thereof with maintaining the lattice constant substantially matching to that of GaAs.

In the present device, such semiconductor materials may compose at least antimony (Sb) and phosphorous (P). Even when these elements are involved in, the lattice constant thereof may be left as substantially matching to that of GaAs. The antimony (Sb) operates as a surfactant, which suppresses a three dimensional growth of the semiconductor layer containing nitrogen (N), thereby improving the crystal quality. On the other hand, the phosphorous (P) may reduce the localized crystal deformation and may enhance the capture of the nitrogen into the crystal.

The active layer 9 may be GaNAs, GaInNAs, GaNAsSb, GaNAsP, GaNAsSbP, GaInNAsSb, GaInNAsP and GaInNAsSbP. These semiconductor materials have the lattice constant substantially equal to or similar to that of GaAs, and may be widely changed in their band-gap energy by adjusting the composition of respective elements.

The first and second cladding layers, 5 and 7, have a band-gap energy greater than that of the active layer 9, which enables carriers to be confined in the active layer 9. Moreover, refractive indices of the first and second cladding layers, 5 and 7, are smaller than that of the active layer, which effectively confines light within the active layer 9. These cladding layers, 5 and 7, may be AlGaInP, GaInP, AlGaAs, and GaInAsP.

The optical integrated device 1 may further provide a fist and a second optical confinement layers, 11 and 13, respectively, to sandwich the active layer 9. The band-gap energy of these optical confinement layers, 11 and 13, is smaller than those of the first and second cladding layers, 5 and 7, and is greater than that of the active layer 9. Therefore, the carriers are confined in the active layer 9 by the cladding layers, 5 and 7, and the optical confinement layers, 11 and 13. On the other hand, refractive indices of the optical confinement layers, 11 and 13, are greater than that of the active layer 9, and smaller than those of the cladding layers, 5 and 7. Therefore, the cladding layers, 5 and 7, may effectively confine light within the optical confinement layers, 11 and 13, and within the active layer 9. The optical confinement layers, 11 and 13, may be one of or a combination of GaAs, GaInAsP, AlGaAs, AlGaInP, and GaInP.

The optical integrated device 1 further comprises a current blocking layer 15 disposed on the second cladding layer 7 to bury a ridge 17 therein. The current blocking layer 15 may be a semiconductor material with high resistivity, or with the first conduction type, to concentrate carriers into the ridge 17. On the current blocking layer 15 and the ridge 17 is provided with a third cladding layer 19 with the second conduction type and a refractive index smaller than that of the active layer 9. The current blocking layer 15 may be one of, or a combination of, AlGaInP, GaInP, AlGaAs and GaInAsP. These materials provide the current blocking layer with band-gap energy greater than that of InP.

On the third cladding layer 19 is provided with a contact layer 21 having the second conduction type and low resistivity. The first device 1a provides first and second electrodes, 23 and 25. The first electrode 23 is formed on the contact layer 21, while the second electrode 25 is on the back surface 3d of the GaAs substrate 3. When the first conduction type is n-type, the first and second electrodes, 23 and 25, function as an anode and a cathode, respectively. Moreover, the optical integrated device 1 may provide, in the second device 1b, at least one of another contact layer and a third electrode both isolated from the contact layer 21 and the first electrode 23. The contact layer may be made of GaAs.

Second Embodiment

Next, a process for manufacturing the optical integrated device shown in FIG. 1A will be described as referring to drawings from FIG. 2A to FIG. 2D.

First, as shown in FIG. 2A, a plurality of semiconductor layers, namely, the first cladding layer 43, the first optical confinement layer 45, the active layer 47, the second optical confinement layer 49, the second cladding layer 51, and the cap layer 53 are grown on a GaAs wafer 41 by the Organo-Metallic Vapor Phase Epitaxy (OMVPE) technique. The first cladding layer 43 has the first conduction type, while the second cladding layer 51 has the second conduction type. The active layer 47, as described previously, has the multi-quantum well structure with a plurality of well layers and barrier layers alternately stacked to each other. The cap layer 53, which covers semiconductor layers formed thereunder, is GaAs. The semiconductor layers for the first device la is provided on the first region 41a, while the layers for the second device 1b is on the second region 41b.

In FIG. 2B, the cap layer 53 provided on the second region 43b is removed by etching using a mask made of photo resist 55 to leave the cap layer 53a in the first region 41a.

Next, as shown in FIG. 2C, the ion implantation is carried out for the second region 41b as the mask 55 is left on the cap layer 53a. Implanted impurities may be Zn, Si, P, N, Ga, As, and C, but not restricted to those elements. Types and thickness of semiconductor layers to be implanted select the elements and the conditions of the implantation, because the photo resist 55 operates as the mask for the implantation to implant in selective only the second region 41b.

Removing the photo resist 55 after the implantation, a silicon nitride (SiN) film 61 covers the cap layer 53a and the contact layer 51 to anneal the implanted layer (63 in FIG. 2D).

After annealing, the film 61 and the cap layer 53a beneath the film 61 are removed. Implanted impurities and defects, such as vacancies induced by the ion implantation, are diffused and reach the second active layer 47b. This diffusion occurs only in the second region 41b exposed to the implanted ions. Due to the diffused impurities and the vacancies, the interdiffusion may be accelerated between the well layers 59a and the barrier layers 59b and between the well layers 59a and the optical confinement layers, 45 and 49. This interdiffusion changes the composition of the well layers 59a and the barrier layer 59b, thereby increasing the band-gap energy of the well layers 59a.

On the other hand, in the first region 41a into which no impurities are implanted, the interdiffusion between the well layers and the barrier layers may not occur, which leaves the composition of the well layers 59a unchanged and so the band-gap energy thereof As a consequence of the interdiffusion during the annealing 63, the band-gap energy in the second active layer 47b becomes greater than that of the first active layer 47a, which means that light from the first active layer 47a is not absorbed in the second active layer 47b. Therefore, when the first active layer 47a functions as an active device such as light-emitting device and light-amplifying device, the second active layer 47b may function as an optical passive device such as optical waveguide. According to the present process, an optical integrated device can be obtained in which an optical active device and an optical passive device are monolithically built in.

A modified process for manufacturing the integrated device will be described below.

According to the first modified process, the interdiffusion occurs without diffusing the implanted impurities into the active layer. That is, by controlling the implanting energy such that the peak in the implantation profile is out of the active layer by a distance, for example, the peak may exist on the second cladding layer, only the vacancies induced by the implantation may diffuse into the active layer. These diffused vacancies accelerate the interdiffusion between the well layer and the barrier layer, namely, atoms in the well layer and atoms in the barrier layer diffuse to each other, which widens the band-gap energy in the second active layer. In this modified process, since the implanted impurities do not diffuse into the active layer, the leak current due to the impurities does not increase. Further, since the active layer is not exposed to the implanted ions, that is, only the vacancies induced by the implantation diffuse into the active layer, the crystal quality of the active layer may not be degraded, thereby suppressing the increase of the lead current attributed to the implanted atoms.

The second modified process for forming the second active layer is described as referring to from FIG. 3A to FIG. 3C.

As shown in FIG. 3A, the insulating film 60 and the cap layer 53 in the second region 41b are etched by using a photo resist 55 as an etching mask. The first region 41a leaves the cap layer 53 and the insulating film 60a thereon. Next, another film 81 is formed on the second region 41b. The film 81, may be made of semiconductor material, containing impurities 83 such as Zn, Si, P, N, Ga, As and C similar to elements implanted in the previously described process, but not restricted to those elements.

After forming the film 81, the thermal treatment 85 is carried out without removing the film 81. During the thermal treatment 85, impurities 83 in the film 81 diffuse into only the second active layer 47b, thereby widening the band-gap energy of the second active layer 47b. In this process, since the impurities 83 are diffused without using the ion implantation, the damage affected to the semiconductor layers by the ion implantation may be relaxed as compared with the previous process. The impurities 83 may be supplied from the vapor phase, that is, when the thermal treatment 83 is carried out in the atmosphere containing impurities above listed, the same effect, i.e. the diffusion into the semiconductor layers only in the second region 41b, may be obtained.

From FIG. 4A to FIG. 4C show still another process to widen the band-gap energy of the second active layer 47b.

As shown in FIG. 4A, only the cover film 87 covering the second region 41b is etched by using the photo resist 55 as an etching mask such that the cap layer 53 is left on the whole of the contact layer 51. Next, only on the second region 41b is formed with a diffusion-accelerating film 89, while on the first region 41a is left with the cover film 87a. After forming the diffusion-accelerating film 89, the annealing 93 of the whole semiconductor layers is carried out. During the annealing 93, atoms in the cap layer 53 diffuse into the diffusion-accelerating film 89 as leaving vacancies 91 in the cap layer 53. The vacancies in the cap layer 53 diffuse into the second active layer 47b, which widens the bang-gap energy thereof.

On the other hand, no vacancies are induced in the first region 41a because the first region 41a is covered by the film 87a that has no function to pull atoms out of the cap layer 53, thereby occurring no interdiffusion of vacancies. Accordingly, the quantum well structure of the first active layer 47a may be maintained.

The diffusion-accelerating film 89 and the cap layer 53 may be silicon die-oxide ($SiO_2$) and GaAs, respectively, by which Ga atoms in the cap layer 53 may diffuse into the $SiO_2$ film to leave vacancies. On the other hand, the cover film 87a may be silicon nitride (SiN) or strontium fluoride ($SrF_2$).

Since this modified process does not use extrinsic impurities, the increase of the leak current due to the impurities can be prevented. The diffusion-accelerating film 89 may depend on the semiconductor material thereunder. Moreover, the cap layer 53 is not always required, that is, the diffusion-accelerating film 89 may be occasionally formed directly on the second cladding layer 51.

Next, the latter half of the process will be described as referring to drawings from FIG. 5A to FIG. 6B. As shown in FIG. 5A, an insulating film 67 such as $SiO_2$ or SiN is formed on the semiconductor layers 65. As shown in FIG. 5B, a portion of the second cladding layer 51 is etched by using the etching-mask 67. Thus etched second cladding layer 51a comprises of a flat portion 51b covering the whole surface of the second optical confinement layer 49, and the ridge 51c arranged on the flat portion 51b. The ridge 51c has a stripe extending along the axis Ax in FIG. 1A. The cross section of the ridge 51c depends on the crystallographic orientation and the etchant. In the present embodiment, the ridge 51c shows a reverse mesa.

The current blocking layer 69 is selectively grown, by the OMVPE technique, in both sides of the ridge 51c on the flat portion 51b to bury the ridge 51c. The blocking layer 69 concentrates carriers supplied from electrodes into the ridge 51c, such that the blocking layer may be made of a material with high resistivity or a semiconductor material with a conduction type opposite to that of the second cladding layer 51a.

Subsequent to the growth of the current blocking layer 69, the third cladding layer 71 and the contact layer 73 are grown on the ridge 51c and the current blocking layer 69. The conduction type of the third cladding layer 71 and that of the contact layer 73 are same with the second cladding layer 51a. Finally, as shown in FIG. 6B, the first electrode 75 is formed on the contact layer 73, while the second electrode 77 is on the back side of the GaAs substrate 41, thus completes the optical integrated device 79.

In the optical integrated device 79, respective active layers, 47a and 47b, are formed such that the band-gap energy of the second active layer 47b is widened by the interdiffusion of impurities including vacancies, after the growth of the active layer 47. Accordingly, The layer structures of the first device 1a and the second device 1b are substantially same to each other except that the structure of respective quantum well layers. The compositions of the first and second quantum well layers are substantially same to each other, and the thickness thereof is substantially equal to each other. Thus, since the difference between the quantum well structures in respective active layers is small and the thickness thereof are thin, the mode field diameter of the light propagating in the second region is substantially same with the mode field diameter of the light propagating in the first region. Moreover, the second active layer smoothly connects with the first active layer. Consequently, the reflection at the interface between the first and second layers may be substantially prevented.

The present optical integrated device has the following advantages considering the structure and the process thereof into account:

(1) The present device shows a relatively low coupling loss at the interface between the first and second regions. In the conventional integrated device, the layer structure in the first device and that in the second region are different to each other, which induces the different mode field diameters and generates substantial reflection at the interface. Occasionally, abnormal growth may occur at the edge of the first region when layers for the second region are epitaxially grown, which also increases the reflection at the interface.

(2) The present device does not cut the waveguide. That is, in the conventional butt-joint structure, the waveguide in the first region is formed by so-called wet etching the waveguide in the second region. In this process, the etching rate of the material may disperse due to the inhomogeneity of the etchant, which scatters the optical characteristic of integrated devices. Moreover, when the wet etching forms the waveguide, it is quite hard to maintain the etching condition, by which the etching rate is determined, such as the concentration of the etchant, the temperature, and the agitation rate. Thus, the reproducibility of the integrated device is inferior in the process using the wet etching. On the other hand, the dry etching process to form the waveguide in the first region occasionally leaves a large etching damage on the crystal, which also degrades the performance and the reliability of the integrated device.

(3) The present process may reduce the number of epitaxial growth and the etching process. That is, in the conventional device, the etching for the first active layer and the epitaxial growth for the second active layer are necessary, which makes the process complex and costly. On the other hand, the present integrated device is processed to form two types of active layers only by the interdiffusion of impurities. This makes the process simple and enhances the productivity of the device.

(4) The present process does not need additional growth of semiconductor layers for forming the second active layer. In the conventional process, when the layers for the second active layer are grown, the mask such as $SiO_2$ or SiN for preventing the growth may be formed on the first region. However, semiconductor materials containing aluminum (Al) may be deposited on such insulating mask, which restricts the flexibility of the subsequent process and materials used therein. Thus, the conventional process restricts the semiconductor material to be deposited for the second region.

On the other hand, in the present process using the ion implantation, the profile of the implanted ions, impurities, is controlled in precise and in homogeneous, thereby enhancing the reproducibility of the process. Moreover, the ridge waveguide applied in the present device is not necessary to etch the active layer in the first device and the waveguide in the second region, which escapes from the degradation of the device originated from this etching, thereby enhancing the reliability of the device. Since the optical confinement along the horizontal direction, parallel to the layer direction, is moderate. Thus, when the integrated device is applied to the optical directional coupler, a span between waveguides may be expanded, which enhances the process margin of the optical directional coupler.

FIG. 7A is a schematic diagram of the conduction band $E_{C1}$ and the valence band $E_{V1}$ in the first active layer while FIG. 7B is a schematic diagram of the conduction band $E_{C2}$ and the valence band $E_{V2}$ in the second active layer. The first active layer 9a includes, as shown in FIG. 1B, well layers 27a and barrier layers 29a. Since the first active layer 9a is not affected by the interdiffusion of the impurities or the vacancies, the well and barrier layers thereof show abrupt interfaces as shown in FIG. 7A. On the other hand, the second active layer 9b, which includes well layers 27b and barrier layers 29b, has relaxed interfaces therebetween, as shown in FIG. 7B, which narrows the effective width of the well potential, thereby raising the quantum level in the well layer. Therefore, the band gap energy E2 between the ground level of the conduction band and that of the valence band becomes greater than the band-gap energy E1 in the first region, where the well potential is not deformed, even when the periods D1 and D2 in respective regions are same. Accordingly, light originated from the band gap energy in the fist region 1a can propagate in the second region 1b without being absorbed therein.

Third Embodiment

FIG. 8A is a perspective view showing another optical integrated device 101 according to the third embodiment of the invention, and FIG. 8B is a schematic diagram showing a layer structure of an active layer of the device shown in FIG. 8A.

The optical integrated device 101 provides a similar structure to those shown in the previously explained device 1 except that the active layer 109, the first and second cladding layers, 105 and 107, and the upper and lower optical confinement layers, 111 and 113, form a mesa 117, while only the upper cladding layer makes the ridge in the first embodiment.

Similar to the previous embodiment, the mesa 117 extends from the first region 3a to the second region 3b. The active layer 109a in the first device 101a also smoothly continues to the second active layer 109b. Both the first and second active layers, 109a and 109b, are sandwiched by the first and second optical confinement layers, 111 and 113, in respective regions, 101a and 101b. Therefore, advantages appeared in the first embodiment are also embodied in this integrated device 101.

The current blocking layer 115 in this device 101, disposed on the flat portion 105b of the first cladding layer 105 to bury the mesa 117, which is called as the buried hetero-structure. The current blocking layer 115 may include a reverse-biased pn-junction, that is, the current blocking layer 115 includes a first blocking layer 115a with the second conduction type and a second blocking layer 115b with a first conduction type on the first blocking layer 115a. Thus, the pn-junction formed in the current blocking layer 115 is biased in reverse when the active layer 109 with the first and second cladding layers 107 are biased in forward, accordingly, substantially no leak current flow in the current blocking layer 115, which concentrates carries injected from the electrode into the mesa 117.

The current blocking layer 115 may be AlGaInP, GaInP, AlGaAs and GaInAsP. These semiconductor materials show band-gap energy greater than that of InP, thereby enhancing the current blocking function.

The optical integrated device 101 may include the same semiconductor materials as those of the first embodiment 1. For instance, semiconductor materials for the first to third cladding layers, 105, 107 and 19, for the first and second optical confinement layers, 111 and 113, and for the quantum well layers and the barrier layers, 27 and 29, and for the contact layer 21, all of which may be same as those used in the first optical device 1. Moreover, the first active layer 109a has the multi-quantum well structure as shown in FIG. 8B, the band diagram of which is shown in FIG. 7A, while the second active layer 109b has the band diagram shown in FIG. 7B. That is, as compared to the first active layer 109a, the second active layer 109b has a relaxed junction profile between the well and the barrier layers, which slightly narrows the width of the well, accordingly, the band-gap energy thereof becomes greater than that of the first active layer 109a. The light generated in the first device 101a may propagate in the second device 101b without being absorbed therein.

FIG. 9 is a cross section showing a modified structure of the optical integrated device 102 compared to that shown in FIG. 8A. The optical integrated device 102 has a mesa 118 including the first and second optical confinement layers, 110 and 114, the active layer 112, and the second cladding layer 116. The mesa 118 excludes the first cladding layer 106 in this optical device 102. By selecting the semiconductor material of the first cladding layer 106 and materials used in the mesa 118, the mesa 118 may be easily etched in selective to the first cladding layer 106.

For example, the second cladding layer 116 may be AlGaInP and GaInP both lattice matched to GaAs, the optical confinement layers, 110 and 114, may be AlGaAs, GaAs, and GaInAsP lattice matched to GaAs, the quantum well layers may be GaNAs, GaInNAs, GaNAsSb, GaNAsP, GaNAsSbP, GaInNAsSb, GaInNAsP or GaInNAsSbP, and the barrier layers in the active layer 112 may be GaAs, GaInAsP, and GaInAs.

When the cladding layer, the active layer and the optical confinement layers are made of materials mentioned above, by using a phosphoric acid solution, the active layer 112 and the confinement layers, 110 and 114, may be selectively etched to the first cladding layer 106. Thus, the structure shown in FIG. 9 can be easily obtained.

In this process of selectively etching the mesa 118, since the first cladding layer operates as an etch-stopping layer, the mesa 118 may be formed with good reproducibility and homogeneity of the process. The width of the mesa 118 depends on the thickness thereof, accordingly, the selectively etching process mentioned above improves the reproducibility and the homogeneity of width of the mesa.

Fourth Embodiment

Next, the process of manufacturing the optical integrated device having the buried hetero-structure shown in FIG. 8 will be described in detail as referring to drawings from FIG. 10A to FIG. 11B.

As described previously, semiconductor layers of the first cladding layer 43, the first optical confinement layer 45, the active layer 47 that includes a plurality of well layers and a plurality of barrier layers, the second confinement layer 49, the second cladding layer 51 and the cap layer 53 are successively grown on the GaAs substrate 41. On the GaAs substrate 41 is provided with a first region 41a for the first device and a second region 41b for the second device.

Only the band-gap energy of the second active layer 47b is widened, by aforementioned methods as referring to drawings from FIG. 2 to FIG. 4, which forms a epitaxial layers E as shown in FIG. 10A. That is, an active device in the first region 41a and a passive device with relatively wider band-gap energy in the second region 41b are monolithically integrated to each other.

Next, the process for manufacturing the optical device using this epitaxial layers E will be explained. An insulating film 167 made of $SiO_2$ or SiN is formed on the top surface of the layers E.

By using this insulating film 167, the second cladding layer 51, the first and second optical confinement layers, 51 and 49, the active layer 47, and a portion of the first cladding layer 45, are etched, thus forming a mesa including the second cladding layer 161a, the active layer 147c, the first and second confinement layers, 145a and 149a, and a portion of the first cladding layer 143b. The cross section of the mesa 117 depends on the crystallographic orientation of the mesa 117 and on the etchant for forming the mesa.

The current blocking layer 169 is grown selectively only on the flat portion 143a of the first cladding layer 143 without removing the insulating film 167, which buries the mesa 117. The blocking layer 169 comprises of the first layer 169a showing the same conduction type with the second cladding layer 151a and the second layer 169b, disposed on the first layer 169a, showing the same conduction type with the first cladding layer 143a. When the active layer is forwardly biased, these two blocking layers are biased in backward, which induces a large built in potential at the interface between two layers, 169a and 169b, thus preventing carriers from flowing therethrough and, accordingly, concentrating carriers into the mesa 117. In a modification, the current blocking layer may be a material with large resistivity.

Subsequent to the process for burying the mesa by the current blocking layer 169, the third epitaxial growth of the third cladding layer 171 and the contact layer 173 is carried out. The conduction type of the third cladding layer 171 and that of the contact layer 173 are the same with the second cladding layer 151a. Finally, the first and second electrodes, 175 and 177, are formed on the contact layer 173 and the back surface of the GaAs wafer 41, respectively, thus completing the optical integrated device 179.

The optical device 179 has similar advantages to those already explained accompanying with the first embodiment. Moreover, in particular for the optical integrated device with the buried hetero-structure, since the active layer has a finite width, both sides of which are buried with the current blocking layer, the carriers are effectively concentrated in the narrow region of the mesa and converted into photons. Further, the light thus generated in the active layer is effectively confined in the mesa, thereby reducing the optical loss therein.

FIG. 12 compares two quantum well structures, one of which shows the band diagram for semiconductor materials lattice constant thereof substantially matched to that of GaAs (FIG. 12A), while the other, FIG. 12B, shows a band diagram for materials whose lattice constant being substantially matched to that of InP. In respective drawings, solid line denotes the band diagram before the interdiffusion of impurities and vacancies, while dotted lines correspond to those after the interdiffusion.

The combination of the GaAs substrate and the quantum well layer composing at least nitrogen (FIG. 12A) shows deeper well compared with the combination of the InP substrate and the quantum well layer lattice matched to the InP substrate (FIG. 12B). For example, for the InP system, when the barrier layer is InP, the band-gap energy is 1.35 eV, and the quantum well layer is made of InGaAsP whose band gap energy is 0.95 eV which corresponds to a wavelength of 1.3 μm, the well depth becomes 0.4 eV. On the other hand, when the same wavelength and the band-gap energy of the well layer made of GaInNAs are assumed, the well depth thereof becomes 0.95 eV, because the band-gap energy of the barrier layer made of GaInP lattice matched to the GaAs substrate is 1.9 eV.

For such quantum well structure, the change of the band-gap energy due to the interdiffusion of the impurities and the vacancies is greater for the GaAs system, $\Delta E^{(GaAs)}$, than that for the InP system, $\Delta E^{(InP)}$, because the original band-gap energy of the MQW structure is greater in the GaAs based system than that of the InP based system as shown in FIG. 12. Accordingly, the GaAs based system shows a substantially equal change in the band-gap energy to that of the InP based system by less interdiffusion compared thereto, which enables to form the integrated device with good quality.

According to the present invention, the active device and the passive device may be monolithically integrated. The active device may be a semiconductor light emitting diode, a semiconductor laser diode, a semiconductor optical amplifier, a semiconductor optical modulator of an electro-absorption type, a semiconductor optical modulator of a Mach-Zehnder type, semiconductor directional coupler and a semiconductor photodiode. The passive device may be an optical waveguide with a straight configuration or with a curved configuration, and an optical coupler such as an optical Y-branch device, an optical directional coupler, a multimode interference device, and an arrayed waveguide.

While the invention has been particularly shown and described with references to preferred embodiments thereof, it will be understood by those skilled in the art that various changes in form and details may be made therein without departing from the spirit and scope of the invention as defined by the appended claims.

We claim:

1. An optical integrated device, comprising:
    a GaAs substrate having a first region and a second region, said second region directly contacting said first region, said first and second regions being arranged along a prescribed axis in this order;
    a first cladding layer commonly disposed on said first region and said second region;
    an active layer disposed on said first cladding layer, said active layer including a first quantum well structure disposed in said first region and a second quantum well structure disposed in said second region and having a thickness substantially equal to a thickness of said first quantum well structure, said second quantum well structure including at least one well layer and two barrier layers puffing said well layer therebetween; and
    a second cladding layer disposed on said active layer,
    wherein said first quantum well structure has a band-gap energy smaller than 1.3 eV and said second quantum well structure has a band-gap energy greater than said band-gap energy of said first quantum well structure, and
    wherein an interface between said well layer and one of said barrier layers of said second quantum well structure is relaxed.

2. The optical integrated device according to claim 1, wherein said active layer includes a group III-V compound semiconductor material containing at least nitrogen (N).

3. The optical integrated device according to claim 2, wherein said active layer further includes at least one of antimony (Sb) and phosphorous (P).

4. The optical integrated device according to claim 1, wherein said active layer includes a group III-V compound semiconductor material containing gallium (Ga), arsenic (As) and nitrogen (N).

5. The optical integrated device according to claim 4, wherein said active layer further includes at least one of antimony (Sb) and phosphorous (P).

6. The optical integrated device according to claim 4, wherein said semiconductor material in said active layer is one of GaNAs, GaInNAs, GaNAsSb, GaNAsP, GaNAsSbP, GaInNAsSb, GaInNAsP, and GaInNAsSbP.

7. The optical integrated device according to claim 1, wherein said first cladding layer is made of at least one of AlGaInP, GaInP, GaInAsP and AlGaAs, and said second cladding layer is made of at least one of AlGaInP, GaInP, GaInAsP and AlGaAs.

8. The optical integrated device according to claim 1, further comprising a current blocking layer, wherein said second cladding layer includes a ridge buried with said current blocking layer.

9. The optical integrated device according to claim 8, wherein said current blocking layer is made of at least one of AlGaInP, GaInP, GaInAsP and AlGaAs.

10. The optical integrated device according to claim 1, further comprising a current blocking layer, wherein said first cladding layer, said active layer and said second cladding layer form a mesa buried with said current blocking layer.

11. The optical integrated device according to claim 10, wherein said current blocking layer is made of at least one of AlGaInP, GaInP, GaInAsP and AlGaAs.

12. The optical integrated device according to claim 1, further comprising a first optical confinement layer sandwiched between said first cladding layer and said active layer and a second optical confinement layer sandwiched between said active layer and said second cladding layer.

* * * * *